United States Patent [19]

Nishigoori

[11] Patent Number: 5,293,503

[45] Date of Patent: Mar. 8, 1994

[54] SEMICONDUCTOR DEVICE HAVING MULTILAYER METAL INTERCONNECTION

[75] Inventor: Tadashi Nishigoori, Tokyo, Japan

[73] Assignee: NEC Corporation, Tokyo, Japan

[21] Appl. No.: 943,228

[22] Filed: Sep. 10, 1992

[30] Foreign Application Priority Data

Sep. 11, 1991 [JP] Japan .................. 3-231300

[51] Int. Cl.[5] ............................. H05K 1/00
[52] U.S. Cl. .................. 174/250; 174/256; 174/258; 174/261; 257/794; 257/586
[58] Field of Search .......... 174/250, 254, 255, 261; 361/397, 398, 409, 414; 257/787, 790, 794, 798, 477, 586

[56] References Cited

U.S. PATENT DOCUMENTS

| | | | |
|---|---|---|---|
| 4,949,162 | 8/1990 | Tamaki et al. | 257/586 X |
| 5,027,188 | 6/1991 | Owada et al. | 257/566 X |
| 5,103,282 | 4/1992 | Isomura et al. | 257/586 X |
| 5,177,584 | 1/1993 | Uchida et al. | 257/477 |

FOREIGN PATENT DOCUMENTS 57-100748 6/1982 Japan .

Primary Examiner—Leo P. Picard
Assistant Examiner—Cheryl R. Figlin
Attorney, Agent, or Firm—Burns, Doane, Swecker & Mathis

[57] ABSTRACT

In a semiconductor device in which the surface of a semiconductor substrate which was subjected to impurity diffusion process, and includes a multilayer metal interconnection layer which is formed on top of it by alternately laminating a metal wiring layer and an interlayer insulating film, the present semiconductor device is characterized in that in a lower layer metal wiring layer there is provided a dummy wiring stripe which is arranged in parallel to two wiring stripes that are formed away from other wiring stripes at a space according to design rules. The width of the wiring stripe is augmented effectively due to the presence of the dummy stripe, and the holding quantity of the material of the coating film which constitutes a part of the interlayer insulating film is increased. Therefore, the flatness of the interlayer insulating film directly over these wiring stripes can be improved, and it becomes possible to secure the uniformity of the film of the upper layer metal wiring layer that is formed on top of the interlayer insulating film.

2 Claims, 2 Drawing Sheets

FIG. 2(a)
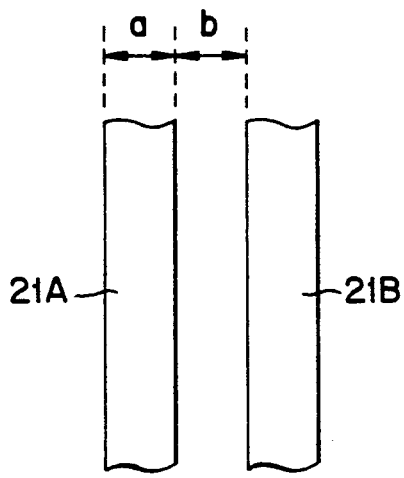
FIG. 3(a)
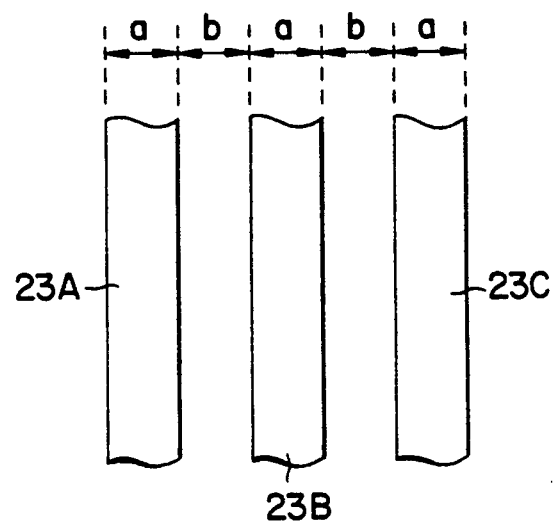
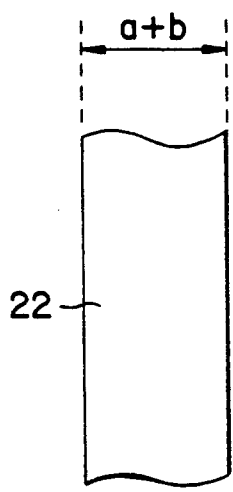
FIG. 2(b)
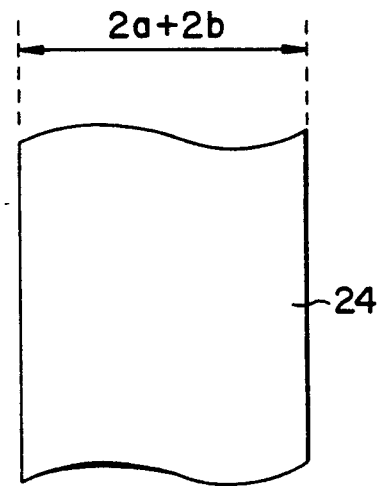
FIG. 3(b)

SEMICONDUCTOR DEVICE HAVING MULTILAYER METAL INTERCONNECTION

BACKGROUND OF THE INVENTION

1. Field of the Invention

The present invention relates to a semiconductor device, and more particularly to a semiconductor device having a multilayer metal interconnection.

2. Description of the Prior Art

With the enhancement of the level of integration of semiconductor devices the multilayer metal interconnection has become to be employed extensively. A multilayer metal interconnection is formed ordinarily by alternately laminating a metal wiring layer consisting of aluminum (A1) or tungsten (W) and an interlayer insulating film after coating the surface of a semiconductor substrate which was subjected to an impurity diffusion process or the like for the formation of semiconductor devices with an insulating film such as a silicon oxide film. The interlayer insulating film between two metal wiring layers consists of a lower layer silicon oxide film by a chemical vapor deposition (CVD) method, a coating (spin on glass (SOG)) film, and an upper layer silicon oxide film by the CVD method which covers the coating film (see Japanese Patent Application Laid Open No. 57-100748). Since the right-angled parts of the edges of the metal film pattern of the metal wiring layer are substantially dulled by the above-mentioned coating film, and the steep level difference due to the lower layer metal wiring is ameliorated, making the surface of the interlayer insulating film covering the wiring layer more flat. As a result, even in the upper metal wiring layer formed on the surface of the interlayer insulating film over the lower metal wiring layer, corresponding to the region of the lower metal wiring layer where a plurality of extra fine metal film stripes are arranged parallel with each other at the minimum allowable space according to design rules, there will not occur too much deterioration in the step coverage, that is, the ratio of the smallest thickness of the metal wiring at the step part to the thickness of the metal wiring at the flat part.

However, when the lower metal wiring layer includes a part where just two extra fine metal film stripes are formed parallel with each other away from other wiring pattern at the minimum space, the flatness of the interlayer insulating film is deteriorated because it is not possible to thoroughly fill in the space between the two metal film stripes in forming the interlayer insulating film that covers the lower metal wiring layer. Accordingly, if an upper layer metal wiring is formed on an interlayer insulating film with a low degree of flatness as in the above, the step coverage of the wiring film is reduced and the disconnection of the wiring is liable to take place. Even if it does not lead to the disconnection of the wiring, there will be generated, in the wiring film, portions with very small thickness which induce electromigration or stress-migration, deteriorating the reliability and the yield of the semiconductor device.

BRIEF SUMMARY OF THE INVENTION

Object of the Invention

It is therefore the object of this invention to provide a semiconductor device with improved reliability and yield, even when a lower wiring layer includes two extra fine metal film stripes that are disposed parallel with each other at the minimum space according to design rules and are arranged away from other wiring patterns, by securing the flatness of an interlayer insulating film on the lower wiring layer to prevent the disconnection or the like of the metal wirings on the interlayer insulating film.

Summary of the Invention

In accordance with this invention, in a semiconductor device comprising a semiconductor substrate with a plurality of circuit elements formed thereon, a metal wiring layer in the lower layer formed on a main surface of the substrate via an insulating film, an interlayer insulating film which includes a lower insulating film covering the metal wiring layer by means of a CVD method, a coating film, and an upper insulating film by the CVD method, and a metallic wiring layer in the upper layer formed on the surface of the interlayer insulating film, there is obtained a semiconductor device which includes two extra fine metal film stripes formed away from other parts parallel with each other at the minimum space according to design rules, and at least one dummy extra fine metal film stripe formed in parallel with the two extra fine metal film stripes at the above-mentioned minimum space.

The above-mentioned coating film has a property that it is formed thicker on a stripe with a large width than on a metal film stripe with a smaller width. By adding a dummy extra fine metal film stripe to the two extra fine metal film stripes disposed parallel with each other it is possible to increase the effective width of the extra fine metal film stripe to 1.5 times that of its actual width and to increase the thickness of the coating film formed on it correspondingly. Since the grooves between the extra fine metal film stripes that are arranged parallel with each other at the aforementioned minimum space can hold the material of the coating film in proportion to the increased size of the effective width of the metal film stripes, the flatness of the surface of the insulating film covering the coating film formed by the CVD method, namely, the interlayer insulating film, can be improved. Consequently, the deterioration in the step coverage is reduced for the upper layer metal wiring layer formed on the surface of the interlayer insulating film, enabling one to avoid the occurrence of the disconnection, electro-migration, or the like.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIGS. 2(a) and 2(b) are layout diagrams showing the design procedure for the metal film stripes of the embodiment; and FIGS. 3(a) and 3(b) are other layout diagrams showing the design procedure for the metal film stripes of the embodiment.

DETAILED DESCRIPTION OF THE PREFERRED EMBODIMENT

Figure 1A:
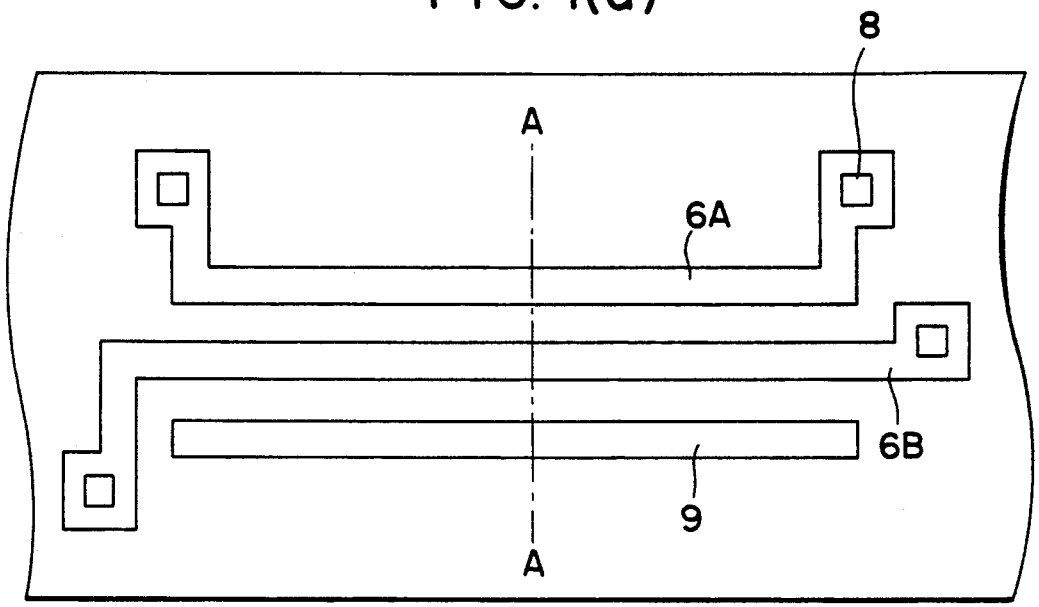
FIG. 1(a) is a plan view of a semiconductor device showing an embodiment of this invention and FIG. 1(b) is an enlarged sectional view of the device taken along the line A—A in FIG. 1(a)

Next, referring to the drawings, an embodiment of this invention will be described.

Figure 1B:
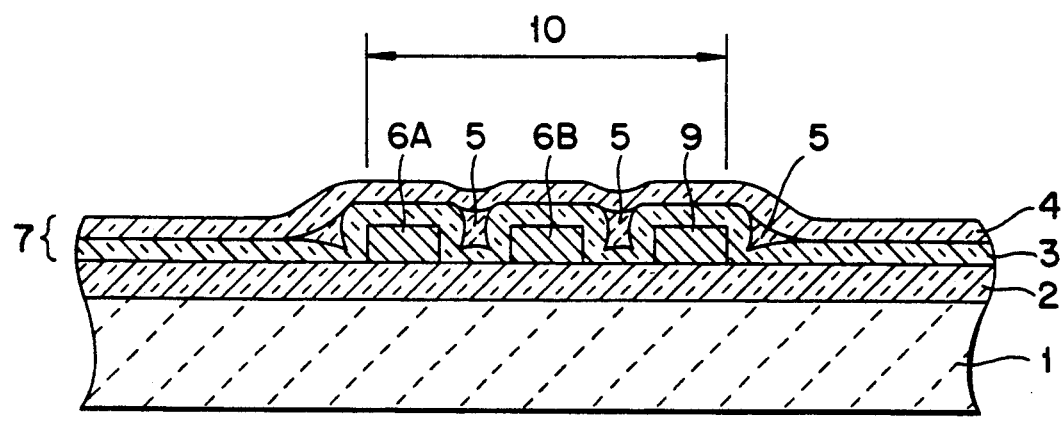

Referring to FIGS. 1(a) and 1(b), an insulating film 2 consisting of silicon oxide is formed on a silicon substrate 1, and two lower layer metal wiring stripes 6A and 6B consisting of A or W or the like are arranged on top of it parallel with each other at the minimum space according to the design rules. These wiring stripes are connected to impurity diffused regions of the substrate 1 through contact holes 8 in the insulating film 2. The width of these wiring stripes 6A and 6B and the space between them are the minimum allowable values according to the design rules, being, for example, 1.0 μm for each. A dummy wiring stripe 9 which is electrically connected to neither of these conductors is formed adjacent to the wiring stripe 6B at the aforementioned minimum space. Then, an interlayer insulating film 7 consisting of a first silicon oxide film 3 by a CVD method, a coating (SOG) film 5 and a second silicon oxide film 4 by the same CVD method is formed on top of the wiring stripes 6A, 6B and 9.

Since the effective wiring width 10 is augmented when a dummy wiring stripe 9 is provided at the same minimum space adjacent to the wiring stripes 6A and 6B that are arranged parallel with each other at the minimum space as in the above, the thickness of the coating film 5 to be formed on these stripes becomes greater compared with the case where the dummy stripe 9 is absent. Accordingly, accompanying the increase in the attached quantity of the coating film 5 to the grooves between the stripes 6A and 6B and 6B and 9, and to the neighborhood on the outside of the stripes 6A and 9, the flatness of the interlayer insulating film 7 is improved. Namely, the ratio of the thickness of the thinnest part of the wiring layer directly over the stripes 6A and 6B to the thickness of the wiring layer at the flat part on the surface of the interlayer insulating film 7, that is, the step coverage of the upper layer metal wiring layer becomes over 80% by the formation of the dummy stripe 9 in contrast to the value of less than 30% in the case where the dummy stripe 9 is absent. As a result, it was possible to remove such a fault as the disconnection of the upper layer metal wiring, thereby improving the reliability and the yield of the semiconductor device.

Next, referring to FIG. 2 and FIG. 3, the technique for detecting the part which requires the formation of the dummy stripe 9 in the lower layer metal wiring layer will be described.

Referring to FIG. 2(a), wiring stripes 21A and 21B are arranged in parallel with stripe width a and minimum space b according to the design rules. The width of each of these stripes 21A and 21B is enlarged by b/2 on both sides of each stripe. Then, the width of the resultant stripe formed by the enlargement is narrowed down toward the inside by (a/2+b/2) each from its both sides. At the stage of enlargement of the width of each stripe by b/2 on its both sides, these stripes 21A and 21B form one resultant stripe, and at the stage of narrowing down the width of the resultant stripe by (a/2 +b/2) each toward the inside from both edge parts in the width direction there is obtained one resultant stripe of width (a+b) (FIG. 2(b)). When the space between the stripes is greater than the minimum space b according to the design rules, the two stripes form two resultant stripes even after the aforementioned width enlargement processing without forming a single united stripe. Accordingly, these resultant stripes vanish since their width become zero by the aforementioned width reduction processing.

When three wiring stripes 23A, 23B and 23C are arrayed parallel with each other having the stripe width a and the minimum space b (FIG. 3(a)), they form a single resultant stripe 24 with wiring width (2a+2b) by the aforementioned width enlargement and reduction processings (FIG. 3(b)). Therefore, when a resultant stripe is formed by enlarging the width of each of the two stripes that are arranged in parallel by b/2 to both sides of the stripe, and if there is detected a wiring stripe which has a width smaller than (a+b) at the stage where the width of the resultant stripe is subjected to the reduction processing by (a/2+b/2) each toward the inside from both edge parts in the width direction of the resultant stripe, then the two original wiring stripes become on object of additional formation of a dummy stripe.

In the above-mentioned embodiment the case of forming the dummy stripe 9 parallel to and on the outside of the wiring stripe 6B is described. However, it is also possible to add another dummy stripe on the outside the wiring stripe 6A. In that case, the flatness of the interlayer insulating film 7 can further be improved by the arrangement the additional dummy stripe.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the scope of the invention.

What is claimed is:

1. A semiconductor device, comprising: a semiconductor substrate; an insulating film formed on a major surface of said semiconductor substrate; a first wiring formed on said insulating film, said first wiring being elongated to provide a first elongated portion; a second wiring formed on said insulating film, said second wiring being elongated to provide a second elongated portion, said first elongated portion and said second elongated portion running in parallel to each other with a first space therebetween; a dummy wiring formed on said insulating film and elongated in parallel to said second elongated portion of said second wiring with a second space therebetween, said first space being substantially equal to said second space; a first interlayer insulating film consecutively covering said first wiring, said second wiring and said dummy wiring and said insulating film to thereby form a first groove along with said first space between said first elongated portion and said second elongated portion and a second groove along with said second space between said second elongated portion and said dummy wiring; a coated insulating film filling said first groove and said second groove to even out a surface of said first interlayer insulating film; and a second interlayer insulating film consecutively covering said first interlayer insulating film and said coated insulating film.

2. The semiconductor device as claimed in claim 1 wherein said coated insualting film comprises a spin on glass film.

* * * * *